(12) United States Patent
Ishino et al.

(10) Patent No.: US 7,531,905 B2
(45) Date of Patent: May 12, 2009

(54) STACKED SEMICONDUCTOR DEVICE

(75) Inventors: Masakzau Ishino, Tokyo (JP); Hiroaki Ikeda, Tokyo (JP); Junji Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/651,517

(22) Filed: Jan. 10, 2007

(65) Prior Publication Data

US 2007/0181991 A1 Aug. 9, 2007

(30) Foreign Application Priority Data

Jan. 20, 2006 (JP) ............................. 2006-011903

(51) Int. Cl.
 *H01L 23/48* (2006.01)
 *H01L 23/52* (2006.01)
 *H01L 29/40* (2006.01)
 *H01L 23/02* (2006.01)

(52) U.S. Cl. ...................... 257/777; 257/686; 257/778; 257/E21.137; 257/E27.144; 257/E27.161

(58) Field of Classification Search ................ 257/686, 257/777, E27.137, E27.144, E27.161
 See application file for complete search history.

(56) References Cited

U.S. PATENT DOCUMENTS

| | | | | |
|---|---|---|---|---|
| 4,394,712 A * | 7/1983 | Anthony | ..................... | 361/779 |
| 5,481,133 A * | 1/1996 | Hsu | ........................... | 257/621 |
| 5,995,379 A * | 11/1999 | Kyougoku et al. | .......... | 361/803 |
| 6,222,276 B1 * | 4/2001 | Bertin et al. | ................. | 257/778 |
| 6,239,495 B1 * | 5/2001 | Sakui et al. | ................. | 257/777 |
| 6,448,661 B1 * | 9/2002 | Kim et al. | .................... | 257/777 |
| 6,538,333 B2 * | 3/2003 | Kong | .......................... | 257/777 |
| 6,577,013 B1 * | 6/2003 | Glenn et al. | ................. | 257/777 |
| 6,608,371 B2 * | 8/2003 | Kurashima et al. | .......... | 257/686 |
| 6,624,506 B2 * | 9/2003 | Sasaki et al. | ................ | 257/686 |
| 6,686,656 B1 * | 2/2004 | Koh et al. | .................... | 257/686 |
| 6,717,251 B2 * | 4/2004 | Matsuo et al. | .............. | 257/686 |
| 6,780,770 B2 * | 8/2004 | Larson | ....................... | 438/689 |
| 6,791,175 B2 * | 9/2004 | Matsuo et al. | .............. | 257/686 |
| 6,809,421 B1 * | 10/2004 | Hayasaka et al. | ........... | 257/777 |
| 7,215,033 B2 * | 5/2007 | Lee et al. | ..................... | 257/777 |
| 7,352,067 B2 * | 4/2008 | Fukaishi et al. | ............. | 257/777 |
| 7,352,602 B2 * | 4/2008 | Janzen | ........................ | 365/63 |
| 7,402,911 B2 * | 7/2008 | Thomas et al. | .............. | 257/777 |
| 2002/0036338 A1 * | 3/2002 | Matsuo et al. | .............. | 257/686 |
| 2002/0074637 A1 * | 6/2002 | McFarland | ................... | 257/686 |
| 2003/0107119 A1 * | 6/2003 | Kim | ........................... | 257/686 |

(Continued)

FOREIGN PATENT DOCUMENTS

JP    2004-327474    11/2004

*Primary Examiner*—Ida M Soward
(74) *Attorney, Agent, or Firm*—Young & Thompson (57) ABSTRACT

A stacked semiconductor device includes an interposer substrate having external power supply terminals, and semiconductor chips stacked on the interposer substrate. A power supply wiring arranged in the semiconductor chip located in the bottom layer is connected to the external power supply terminal via a bump electrode, the power supply wiring arranged in the semiconductor chip located in the top layer is connected to the external power supply terminal via a bonding wire, and the power supply wirings each arranged in adjacent semiconductor chips are mutually connected via the through electrode. Such a loop structure can solve a problem such that the higher the semiconductor chip, the larger its voltage drop.

18 Claims, 8 Drawing Sheets

U.S. PATENT DOCUMENTS

2005/0001306 A1* 1/2005 Matsuo et al. ............. 257/686
2005/0205968 A1* 9/2005 Kim ........................... 257/621
2005/0280160 A1* 12/2005 Kim et al. ................... 257/777
2006/0102993 A1* 5/2006 Tsai et al. ................... 257/686
2006/0220212 A1* 10/2006 Chen et al. ................. 257/686

* cited by examiner

PRIOR ART

FIG.8

PRIOR ART

STACKED SEMICONDUCTOR DEVICE

TECHNICAL FIELD

The present invention relates to a stacked semiconductor device. More specifically, the present invention relates to a stacked semiconductor device that can prevent a voltage drop in power source.

BACKGROUND OF THE INVENTION

In recent years, the storage density of semiconductor memory devices, represented by a DRAM (Dynamic Random Access Memory), has increased. It is increasingly demanded that these devices can operate at higher speeds. The increase in storage capacity has been achieved by making memory cells smaller and by increasing the chip size. However, the miniaturization of memory cells is physically limited, and the increase in chip size leads to a reduction of yield and impairs an increase of operating speed.

To solve these problems fundamentally, there has been proposed a method such that a core unit having memory cells and an interface unit having peripheral circuits to the memory cells are provided as chips that are independent of each other, and a plurality of core chips can be allocated to one interface chip (see Japanese Patent Application Laid-open No. 2004-327474). This can greatly decrease the size of each chip. In view of this, the method is expected to increase the storage density of semiconductor memory devices even more, while preserving high yield of the semiconductor memory devices.

Assume that the core-unit and the interface unit are separate chips. The core chip and the interface chip can be fabricated in a memory process and a logic process, respectively. Generally, transistors made in the logic process can operate at higher speed than the transistors made in the memory process. Hence, if the interface chip is manufactured in the logic process, it can operate faster than the conventional interface chips. As a result, the interface chip enables the semiconductor memory device incorporating it to operate at high speed. Furthermore, the operating voltage of the interface chip can be lowered by about 1V, which helps to reduce the power consumption in the semiconductor memory device.

As described in Japanese Patent Application Laid Open No. 2004-327474, the stereoscopic stacking of the plurality of semiconductor chips permits suppression of an increase in a packaging area on the printed circuit board.

Figure 7:
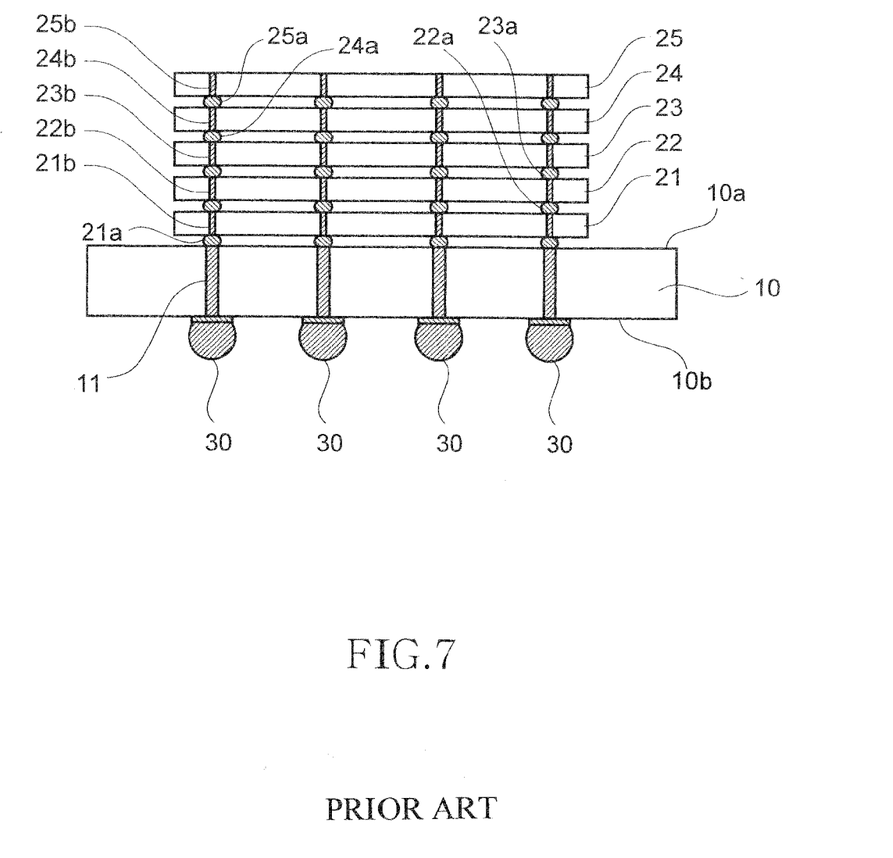
FIG. 7 is a schematic cross sectional view showing a structure of a conventional stacked semiconductor device.

FIG. 7 is a schematic cross sectional view showing a structure of a conventional stacked semiconductor device.

As shown in FIG. 7, the conventional stacked semiconductor device includes an interposer substrate 10, a plurality of (five, in one example) semiconductor-chips 21 to 25 stacked on one surface 10a of the interposer substrate 10, and external power supply terminals 30 arranged on the other surface 10b of the interposer substrate 10. The semiconductor chips 21 to 25 can include core chips or interface chips, or both of the chips. In addition to the external power supply terminals 30, the stacked semiconductor device includes an external signal terminal that sends and receives an address, data, a command or the like. This terminal is not shown the drawings.

Each of the external power supply terminals 30 is a terminal to which a higher-potential power-supply voltage (Vdd) and a lower-potential power-supply voltage (GND) are supplied. The external power supply terminal 30 is connected to the semiconductor chip 21 via a through electrode 11 formed through the interposer substrate 10, and a bump electrode 21a arranged on the semiconductor chip 21, and a through electrode 21b arranged in the semiconductor chip 21. With this arrangement, a power supply potential is applied to an internal circuit (not shown) in the semiconductor chip 21 located in the bottom layer. The power is supplied to the semiconductor chips 22 to 25 located above the semiconductor chip 21 in a cascade manner via bump electrodes 22a to 25a and through electrodes 22b to 25b arranged on and in the semiconductor chips 22 to 25.

Figure 8:
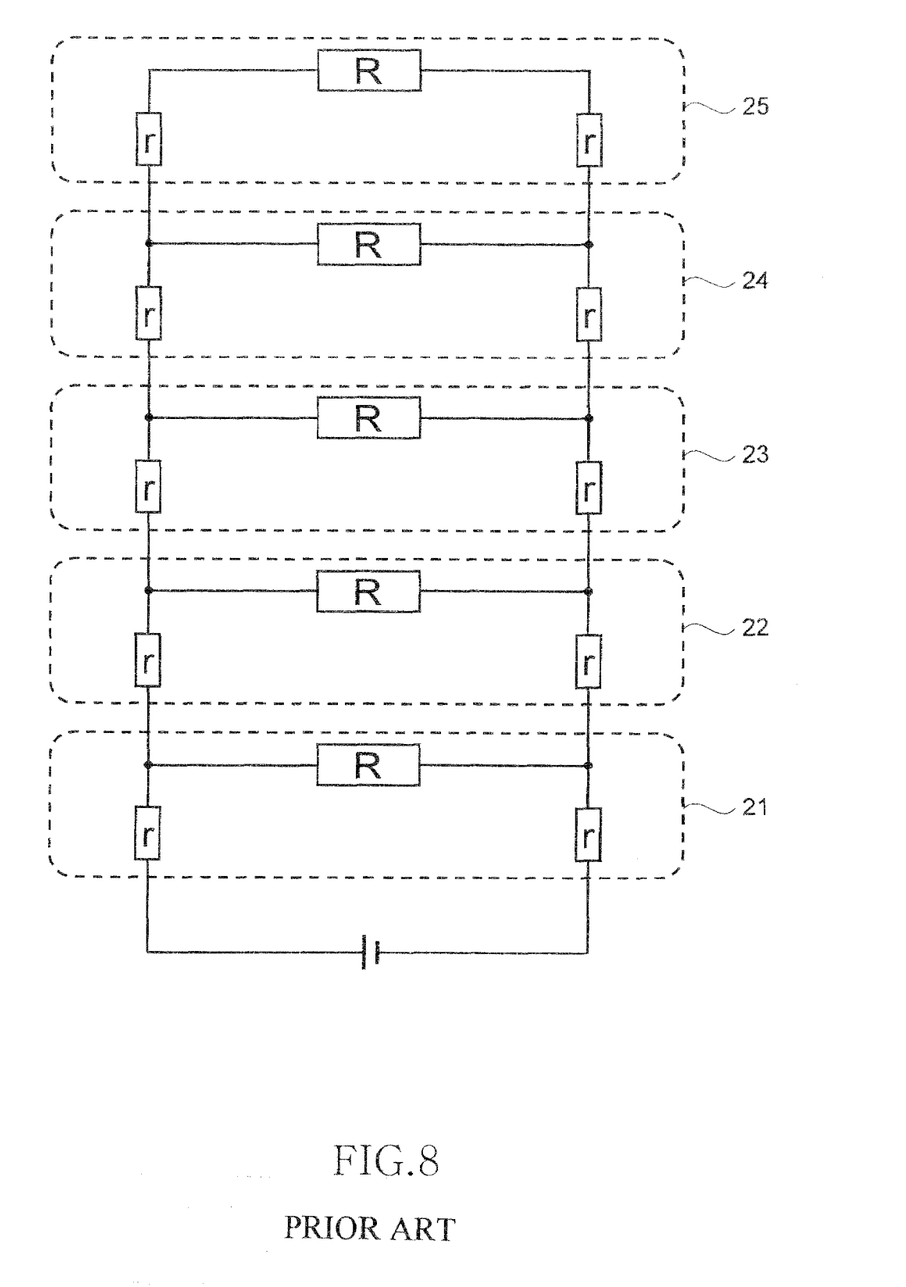
FIG. 8 is an equivalent circuit diagram showing only a power source portion of the stacked semiconductor device shown in FIG. 7.

FIG. 8 is an equivalent circuit diagram showing only a power source portion of the stacked semiconductor device shown in FIG. 7.

In FIG. 8, r represents resistance components by the through electrodes 21b to 25b, and R represents resistance components by internal circuits of the semiconductor chips 21 to 25. The stacked semiconductor device shown in FIG. 7 is a so-called face-up stacked semiconductor device, in which each layer is stacked so that the principal surface on which the internal circuit is formed faces upward. Thus, both the higher-potential power-supply voltage (Vdd) and the lower-potential power-supply voltage (GND) need to go through the five resistance components r connected in series to reach the internal circuit of the semiconductor chip 25 located in the top layer. Accordingly, this need causes a problem such that the higher the semiconductor chip, the larger the voltage drop caused by the resistance component r, and thus, the voltage applied to the internal circuit R decreases.

This effect caused by the voltage drop becomes more apparent as electric resistances of the through electrodes 21b to 25b are larger, and further, as the number of semiconductor chips to be stacked is larger. Particularly, in recent years, there have been cases where a power source voltage is required to set to 2V or less because a lower voltage is required, and the voltage drop can easily occur due to an increase in power consumption. It is thus anticipated that the effect of the through electrode on the resistance component r cannot be neglected in the future.

For example, when polycrystalline silicon having a specific resistance of $10^{-5}\Omega$ is used as a material for the through electrodes 21b to 25b, radiuses of the through electrodes 21b to 25b are each 10 μm, and lengths thereof are each 50 μm, a resistance per one through electrode is then about 1.6Ω. For example, even when 20 through electrodes are connected in parallel to decrease the resistance, a resistance value (=r) per one layer is about 0.08Ω. On the other hand, when the semiconductor chips 21 to 25 are core chips of a DRAM, a power source voltage is about 1.8V, and a resistance component R by the internal circuit is about 18Ω.

When a voltage drop level is calculated based on these values to evaluate the voltage applied to the internal circuits of the semiconductor chips 21 to 25, the following are obtained: a voltage applied to the internal circuit of the semiconductor chip 21 is about 1.73V (voltage drop=about 0.07V); a voltage applied to the internal circuit of the semiconductor chip 22 is about 1.67V (voltage drop=about 0.13V); a voltage applied to the internal circuit of the semiconductor chip 23 is about 1.62V (voltage drop=about 0.18V); a voltage applied to the internal circuit of the semiconductor chip 24 is about 1.59V (voltage drop=about 0.21V); and a voltage applied to the internal circuit of the semiconductor chip 25 is about 1.58V (voltage drop=about 0.22V).

Usually, the minimum operability assuring voltage of a DRAM of which a power source voltage is 1.8V is about 1.65V. This means that the semiconductor chips 23 to 25 located above fall below this level.

The stacked semiconductor device shown in FIG. 7 is a so-called face-up stacked semiconductor device. In contrary, there is a so-called face-down stacked semiconductor device in which each layer is stacked so that the principal surface faces downward. In this face-down stacked semiconductor device also, a similar problem occurs. The problem described above occurs not only to a DRAM, but also occurs to the stacked semiconductor devices as a whole.

SUMMARY OF THE INVENTION

The present invention has been achieved to solve the above problems, and an object of the present invention is to provide a stacked semiconductor device capable of suppressing a decrease in a power source voltage caused by its voltage drop.

The above and other objects of the present invention can be accomplished by a stacked semiconductor device in which a plurality of semiconductor chips including at least first and second semiconductor chips are stacked, comprising:

an external power supply terminal;

a first connection means that electrically connects a power supply wiring arranged in the first semiconductor chip and the external power supply terminal;

a second connection means that electrically connects a power supply wiring arranged in the second semiconductor chip and the external power supply terminal; and a third connection means that mutually electrically connects the power supply wirings each provided in adjacent semiconductor chips.

The stacked semiconductor device according to the present invention preferably includes an interposer substrate on which the external power supply terminal is arranged, wherein the plurality of semiconductor chips are stacked on the interposer substrate. In this case, it is preferably that the first semiconductor chip is a semiconductor chip nearest to the interposer substrate, and the second semiconductor chip is a semiconductor chip farthest from the interposer substrate.

The stacked semiconductor device according to the present invention preferably includes a cap substrate arranged opposite, seen from the second semiconductor chip, to the interposer substrate. The stacked semiconductor device according to the present invention also preferably includes an intermediate interposer substrate arranged between the first semiconductor chip and the second semiconductor chip.

As explained above, the stacked semiconductor device according to the present invention employs a configuration such that a power source voltage is supplied not from only one direction, but from at least two directions, so that a voltage drop level is reduced and thus it is possible to suppress a decrease in a power source voltage caused by its voltage drop.

The arrangement of an interposer substrate on which a plurality of semiconductor chips are mounted makes it possible to easily supply a power source potential to a second semiconductor chip by using a bypass conductor such as a bonding wire.

The arrangement of an intermediate interposer substrate between a first semiconductor chip and a second semiconductor chip makes it possible to supply the power source voltage from three or more directions to the plurality of semiconductor chips. Accordingly, it becomes possible to suppress the decrease in the power source voltage caused by its voltage drop more effectively. The arrangement of a cap substrate on the second semiconductor chip makes it possible to prevent a breakage of the second semiconductor chip upon connection of the bypass conductor such as a bonding wire.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
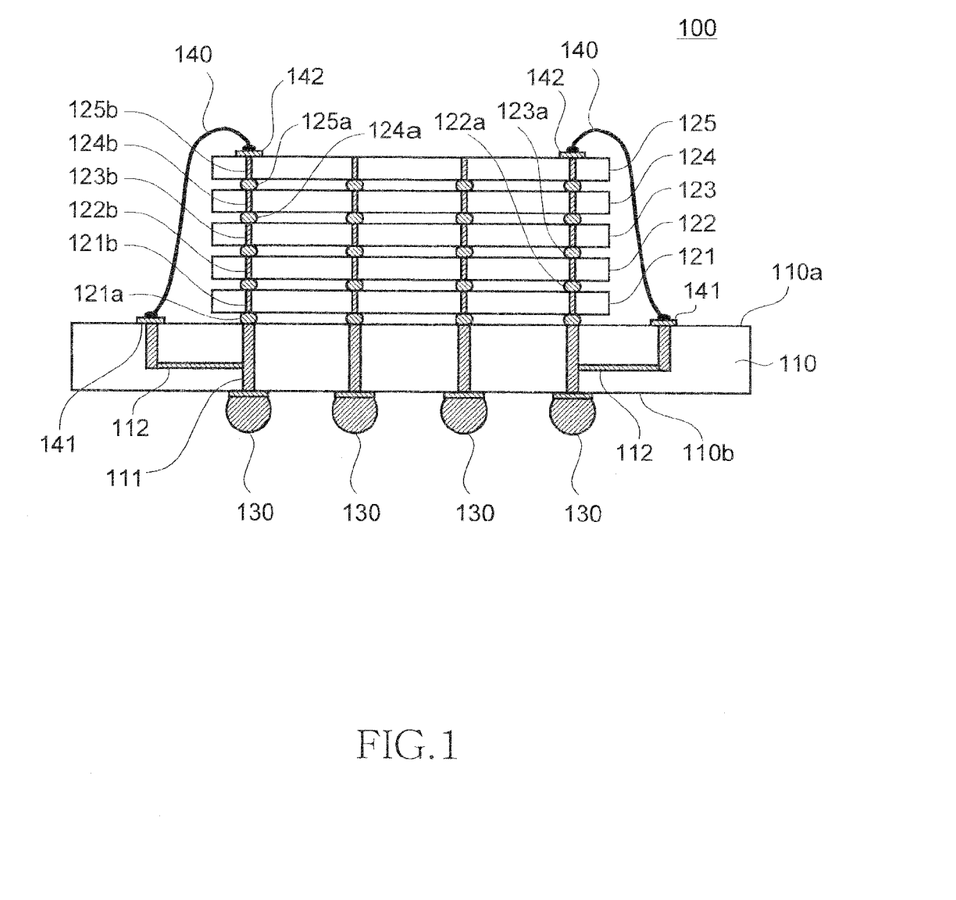
FIG. 1 is a schematic cross sectional view showing a structure of a stacked semiconductor device according to a preferred first embodiment of the present invention.

FIG. 1 is a schematic cross sectional view showing a structure of a stacked semiconductor device 100 according to a preferred first embodiment of the present invention.

As shown in FIG. 1, the stacked semiconductor device 100 according to the present embodiment includes an interposer substrate 110, five semiconductor chips 121 to 125 stacked on one surface 110a of the interposer substrate 110, and external power supply terminals 130 arranged on the other surface 110b of the interposer substrate 110. While types of the semiconductor chips 121 to 125 are not particularly limited, core chips or interface chips, or the both chips can be used, when the stacked semiconductor device according to the embodiment is a DRAM. The number of stacked semiconductor chips is not limited to five, as long as it is two or more.

Besides the external power supply terminals 130, external signal terminals that input and output addresses, data, commands and the like are formed on the other surface 110b of the interposer substrate 110. Since the external signal terminals are not directly related to the scope of the present invention, it is not shown in the drawings. The reason for the omission is that a signal component such as an address, data, and a command is minimal in a current level as compared to a power supply, and does not cause a significant voltage drop.

The semiconductor chips 121 to 125 are mounted on the interposer substrate 110 so that each circuit forming surface faces upward. That is, each chip is stacked in a face-up manner. On rear surfaces (bottom surfaces) of the semiconductor chips 121 to 125, there are formed bump electrodes 121a to 125a, respectively. The bump electrodes 121a to 125a go through the through electrodes 121b to 125b each arranged in the semiconductor chips 121 to 125 and are connected to power source wirings, which are internal circuits of the semiconductor chips 121 to 125. The bump electrodes 121a to 125a and the through electrodes 121b to 125b shown in FIG. 1 form one portion of the power source wirings each arranged in the semiconductor chips 121 to 125. While a signal such as an address, data, a command is sent and received via the bump electrodes and the through electrodes, the signal is not shown in the drawings due to the reason described above.

As shown in FIG. 1, the bump electrodes of the semiconductor chips located on a relatively higher side are located on the through electrodes of the semiconductor chips located on a relatively lower side. Thereby, a short-circuited state is formed from the power source wiring of the semiconductor chip 121 located on the bottom layer to the power source wiring of the semiconductor chip 125 located on the top layer, via the bump electrodes and the through electrodes.

Each of the external power supply terminals 130 is a terminal to which a higher-potential power-supply voltage (Vdd) and a lower-potential power-supply voltage (GND) are supplied. The external power supply terminal 130 is connected to the bump electrode 121a via the through electrode 111 arranged in the interposer substrate 110. Thereby, the semiconductor chip 121 located in the bottom layer is directly supplied with a power supply potential.

Furthermore, in the present embodiment, on the one surface 110a of the interposer substrate 110, there is further formed a bonding pad 141. The bonding pad 141 is connected to the external power supply terminal 130 via an internal wiring 112 arranged in the interposer substrate 110. A bonding pad 142 is arranged in the semiconductor chip 125 located in the top layer. These two bonding pads 141 and 142 are connected via a bonding wire 140. The bonding pad 142 arranged in the semiconductor chip 125 is connected to the power supply wiring within the semiconductor chip 125. Thereby, a power supply potential is also directly supplied to the semiconductor chip 125 located in the top layer.

Further, the bonding pad 142 arranged in the semiconductor chip 125 is also connected to the through electrode 125b arranged in the semiconductor chip 125. Thereby, the power supply wiring comes to possess a loop structure including a portion that goes through the bump electrodes 121a to 125a and the through electrodes 121b to 125b, and a portion that goes through the bonding wire 140.

Thus, the power supply wiring arranged in the semiconductor chip 121 located in the bottom layer is connected to the external power supply terminal 130 via the bump electrode 121a, which is a first connection means. The power supply wiring arranged in the semiconductor chip 125 located in the top layer is connected to the external power supply terminal 130 via the bonding wire 140, which is a second connection means. The power supply wirings each arranged in adjacent semiconductor chips 121 to 125 are mutually connected via the through electrodes 121b to 125b.

Figure 2:
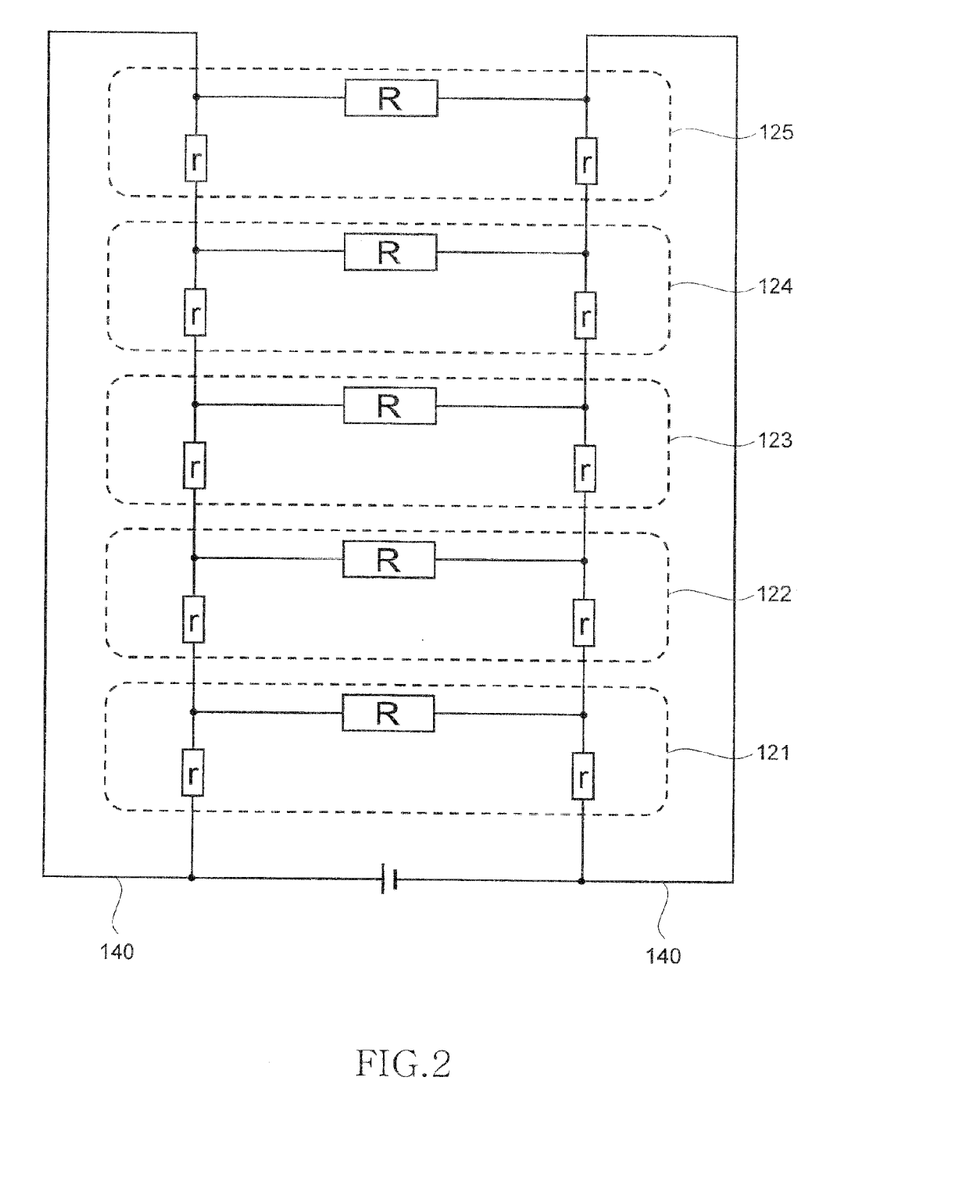
FIG. 2 is an equivalent circuit diagram showing only a power supply portion of the stacked semiconductor device shown in FIG. 1.

FIG. 2 is an equivalent circuit diagram showing only a power supply portion of the stacked semiconductor device 100 according to the present embodiment.

In FIG. 2, r represents resistance components by the through electrodes 121b to 125b, and R represents resistance components by internal circuits of the semiconductor chips 121 to 125. As shown in FIG. 2, in the present embodiment, the power supply wiring has a loop structure. The power supply potential is applied from the semiconductor chip 121 side in the bottom layer to the plurality of semiconductor chips 121 to 125 in a cascade manner, and the power supply potential is applied from the semiconductor chip 125 side in the top layer to the plurality of semiconductor chips 121 to 125 in a cascade manner. That is, the power supply potential is applied from both the semiconductor chip 121 located in the bottom layer and the semiconductor chip 125 located in the top layer. Thereby, unlike the conventional stacked semiconductor device, a problem such that the higher the semiconductor chip, the larger the voltage drop caused by the resistance component r can be solved. As a result, it becomes possible to suppress a decrease in voltage applied to the internal circuit R.

In order to decrease the effect of the voltage drop effectively, it is preferable to lower the resistance value of the bonding wire 140 as much as possible. For this purpose, it is preferable to select a material having resistance as low as possible, as a material for the bonding wire 140, or to arrange a plurality of bonding wires 140 in parallel. For example, when gold (Au) is used as a material for the bonding wire 140; the length thereof is 2 mm; and the diameter thereof is 30 μm, the resistance of the bonding wire 140 is then 0.056Ω. When four of such bonding wires 140 are aligned in parallel, the entire resistance can then be decreased to as much as 0.014Ω. As explained above, the resistance per one through electrode in which polycrystalline silicon is used is about 1.6Ω, so that it is easily understood that the advantage achieved by bypassing the power supply wiring by the bonding wire 140 is very high.

In the present embodiment, the more intermediate the semiconductor chips located, the lower the voltage applied to the internal circuit. Even so, it is possible to suppress the maximum level of the voltage drop to about 0.1V when the number of stacked layers is five. Accordingly, when the stacked semiconductor device according to the embodiment is a DRAM, even when the power source voltage is 1.8V, the voltage applied to each semiconductor chips 121 to 125 is equal to or more than 1.7V, whereby it is possible to secure the minimum operability assuring the voltage of a DRAM of equal to or more than 1.65V.

A stacked semiconductor device according to a second embodiment of the present invention is explained next.

Figure 3:
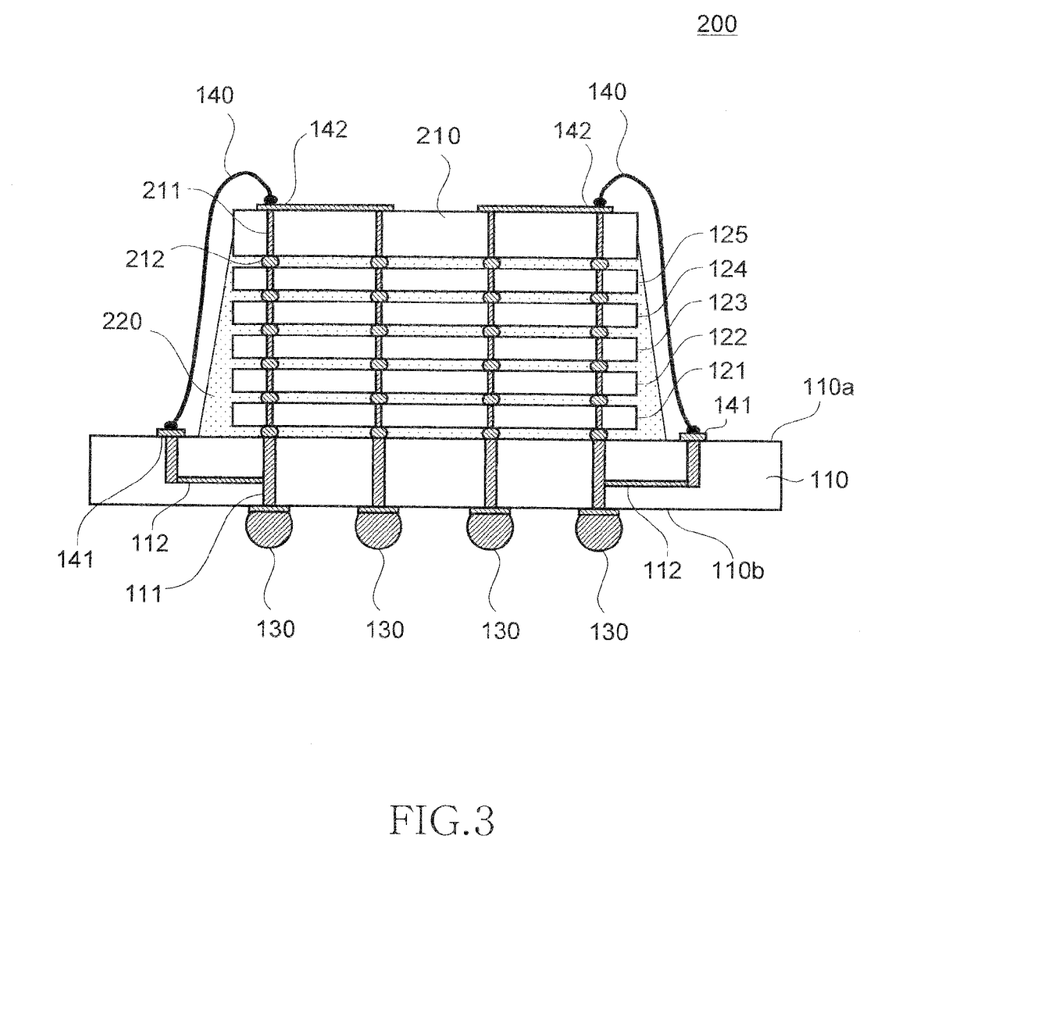
FIG. 3 is a schematic cross sectional view showing a structure of a stacked semiconductor device according to a preferred second embodiment of the present invention.

FIG. 3 is a schematic cross sectional view showing a structure of a stacked semiconductor device 200 according to the second embodiment.

As shown in FIG. 3, the stacked semiconductor device 200 according to the second embodiment is different from the stacked semiconductor device 100 according to the first embodiment in that a cap substrate 210 is arranged above the semiconductor chip 125 and an underfill material 220 is arranged between the interposer substrate 110 and the cap substrate 210. Since the rest of the configuration is basically the same as that of the stacked semiconductor device 100 according to the first embodiment, like parts are designated with like reference numerals, and redundant explanations will be omitted.

The cap substrate 210 serves to protect the semiconductor chips 121 to 125 from an impact generated at the time of bonding. That is, in the first embodiment, it is necessary to directly bond the semiconductor chip 125 located in the top layer, so that when the semiconductor chips 121 to 125 are thinned due to polishing or the like, the semiconductor chips 121 to 125, in particular the semiconductor chip 125 located in the top layer, can probably be damaged.

On the contrary, in the stacked semiconductor device 200 according to the present embodiment, the cap substrate 210 is arranged above the semiconductor chip 125 located in the top layer and the wire bonding is performed on the bonding pad 142 arranged on the cap substrate 210. Thus, the impact applied to the semiconductor chips 121 to 125 is lessened. This arrangement makes it possible to prevent the semiconductor chips 121 to 125 from being damaged, which is caused due to the wire bonding impact, even when the semiconductor chips 121 to 125 have been thinned.

As shown in FIG. 3, a through electrode 211 and a bump electrode 212 are arranged on the cap substrate 210. The bonding pad 142 and the power supply wiring of the semiconductor chip 125 are connected via the through electrode 211 and the bump electrode 212. Thus, the circuit configuration of the stacked semiconductor device 200 is almost the same as that of the stacked semiconductor device 100 according to the first embodiment.

Figure 4:
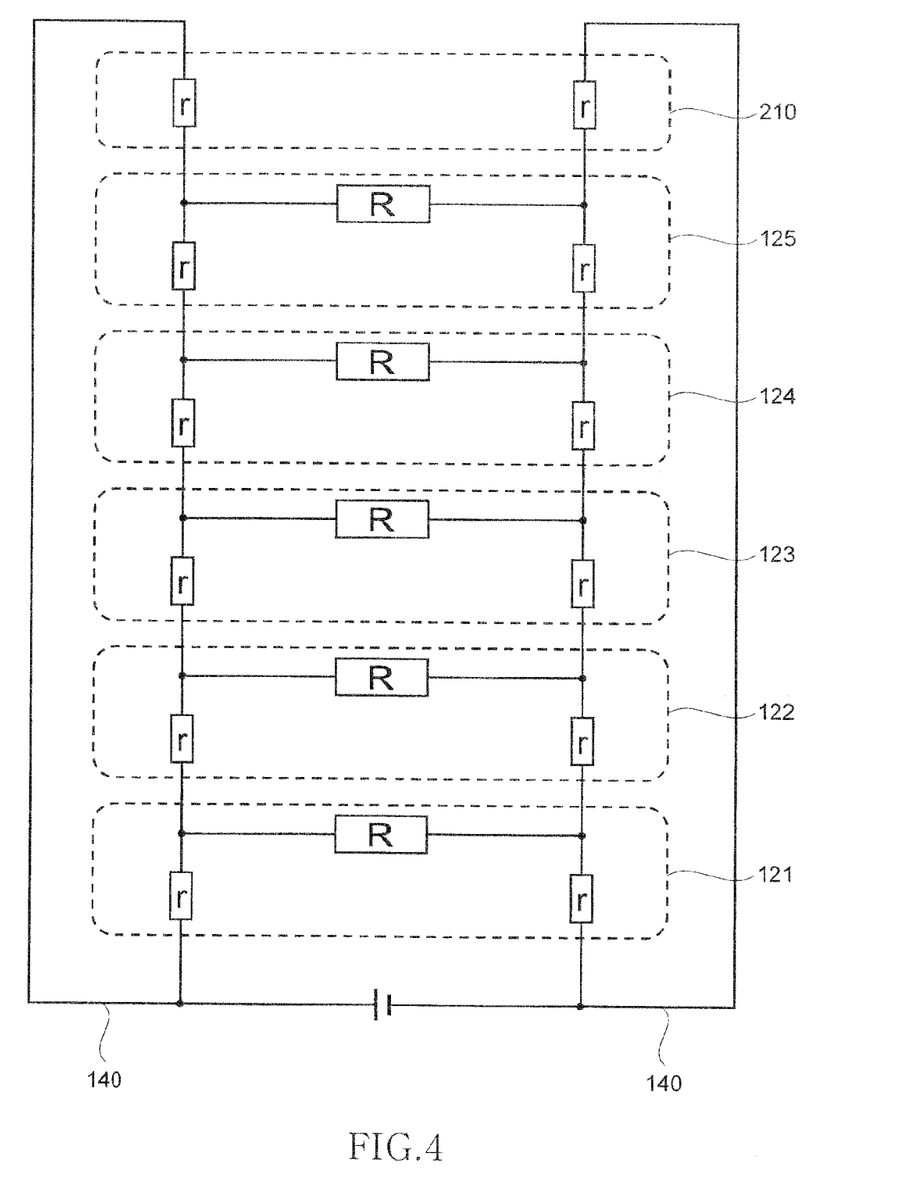
FIG. 4 is an equivalent circuit diagram showing only a power supply portion of the stacked semiconductor device shown in FIG. 3.

FIG. 4 is an equivalent circuit diagram showing only a power supply portion of the stacked semiconductor device 200 according to the present embodiment.

As shown in FIG. 4, the circuit configuration of the stacked semiconductor device 200 is almost the same as that of the stacked semiconductor device 100 according to the first embodiment. However, in the stacked semiconductor device 200, a resistance component r by the through electrode 211 arranged in the cap substrate 210 is inserted in series between the semiconductor chip 125 and the bonding wire 140. Thus, as compared to the first embodiment, the voltage applied to the internal circuit R of each semiconductor chip 121 to 125 slightly decreases. Such a voltage drop can be lessened by using a low resistive material such as copper (Cu) as a material for the through electrode 211 arranged in the cap substrate 210. The low resistive material such as copper (Cu) may contaminate a semiconductor substrate when it is not correctly used. However, since it is not necessary to form an active element such as a transistor on the cap substrate 210, it is possible to use such a low resistive material without any problem.

While the material for the cap substrate 210 is not particularly limited, the use of the same material as those of the semiconductor chips 121 to 125 is preferable. That is, when the semiconductor chips 121 to 125 are configured by a silicon substrate, it is preferable that the silicon substrate be used for the cap substrate 210. The use of the same material for the both components can prevent an occurrence of stresses caused due to a difference in coefficient of thermal expansion. The thickness of the cap substrate 210 can be set to such an extent that no damage occurs by the impact applied at the time of the wire bonding.

In the present embodiment, an underfill material 220 is arranged between the interposer substrate 110 and the cap substrate 210. The underfill material 220 is a sealant made of resin or the like, and serves to protect physically and chemically the semiconductor chips 121 to 125. The underfill material 220 also serves to lessen an impact that is generated at the time of wire bonding and is transmitted to the semiconductor chips 121 to 125, which are below the cap substrate 210, via the bump electrodes 121a to 125a and 212.

A stacked semiconductor device according to a third embodiment of the present invention is explained next.

Figure 5:
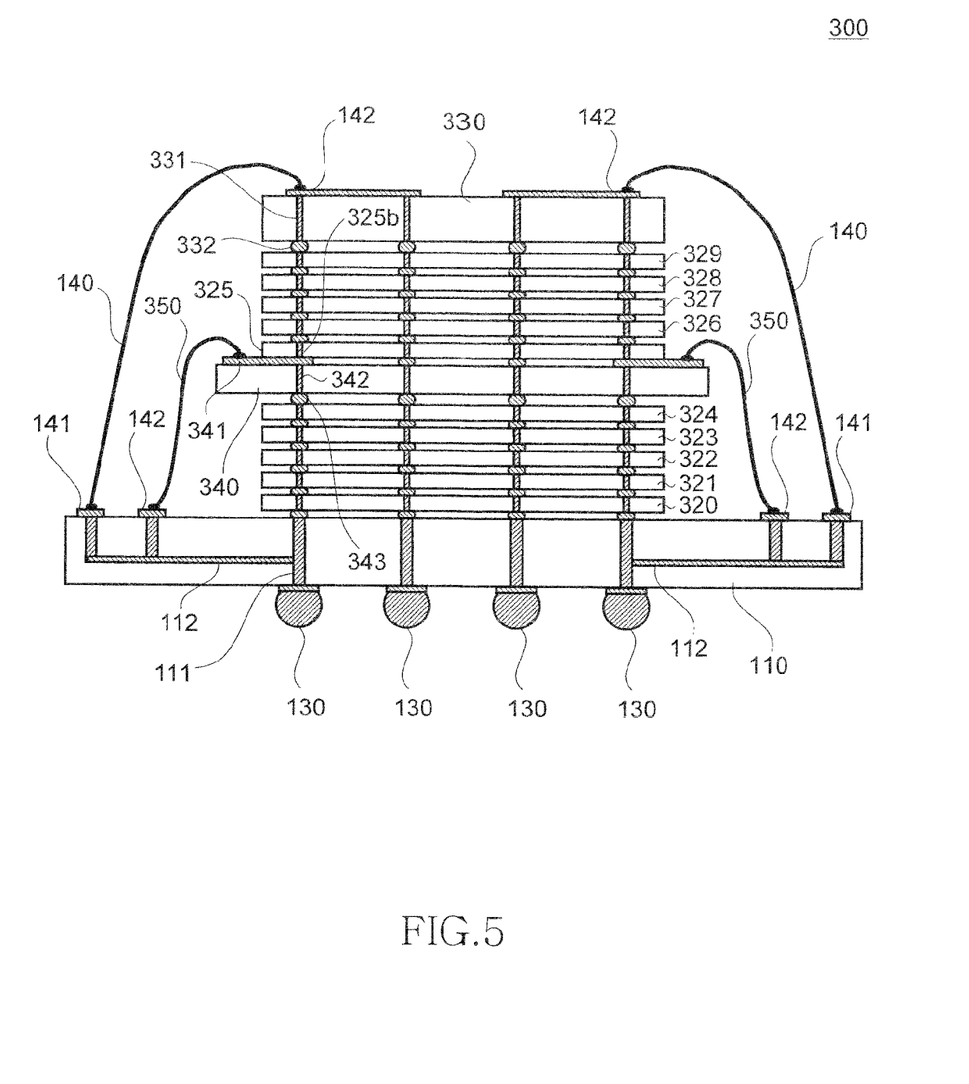
FIG. 5 is a schematic cross sectional view showing a structure of a stacked semiconductor device according to a preferred third embodiment of the present invention.

FIG. 5 is a schematic cross sectional view showing a structure of a stacked semiconductor device 300 according to the third embodiment.

As shown in FIG. 5, the stacked semiconductor device 300 according to the present embodiment is configured such that ten semiconductor chips 320 to 329 are stacked on the interposer substrate 110; a cap substrate 330 is arranged above the semiconductor chip 329 located in the top layer; and an intermediate interposer substrate 340 is arranged between lower-half five layers of the semiconductor chips 320 to 324 and upper-half five layers of the semiconductor chips 325 to 329.

The cap substrate 330 serves the same role as that of the cap substrate 210 used in the second embodiment. That is, the cap substrate 330 serves to lessen an impact generated at the time of wire bonding. The bonding wire 140 is connected to the bonding pad 142 arranged on the cap substrate 330. Thus, a power supply potential is directly applied to the semiconductor chip 329 located in the top layer via a through electrode 331 and a bump electrode 332.

Meanwhile, the intermediate interposer substrate 340 serves to improve the characteristics of the first and second embodiments. That is, the more intermediate the semiconductor chips located, the lower the voltage applied to the internal circuit. The intermediate interposer substrate 340 also includes a bonding pad 341, and the bonding pad 341 is connected to a different bonding pad 142 arranged on the interposer substrate 110 via a bonding wire 350. The bonding pad 142 is connected to the external power supply terminal 130 via the internal wiring 112 arranged in the interposer substrate 110, as shown in FIG. 5.

The bonding pad 341 arranged on the intermediate interposer substrate 340 is connected via a through electrode 325b to a power supply wiring of the semiconductor chip 325 located in a higher layer, and connected via a through electrode 342 and a bump electrode 343 to a power supply wiring of the semiconductor chip 324 located in a lower layer. That is, the power supply potential can be directly applied to the intermediate semiconductor chips 324 and 325 where the voltage drop is the largest in the first and second embodiments.

Figure 6:
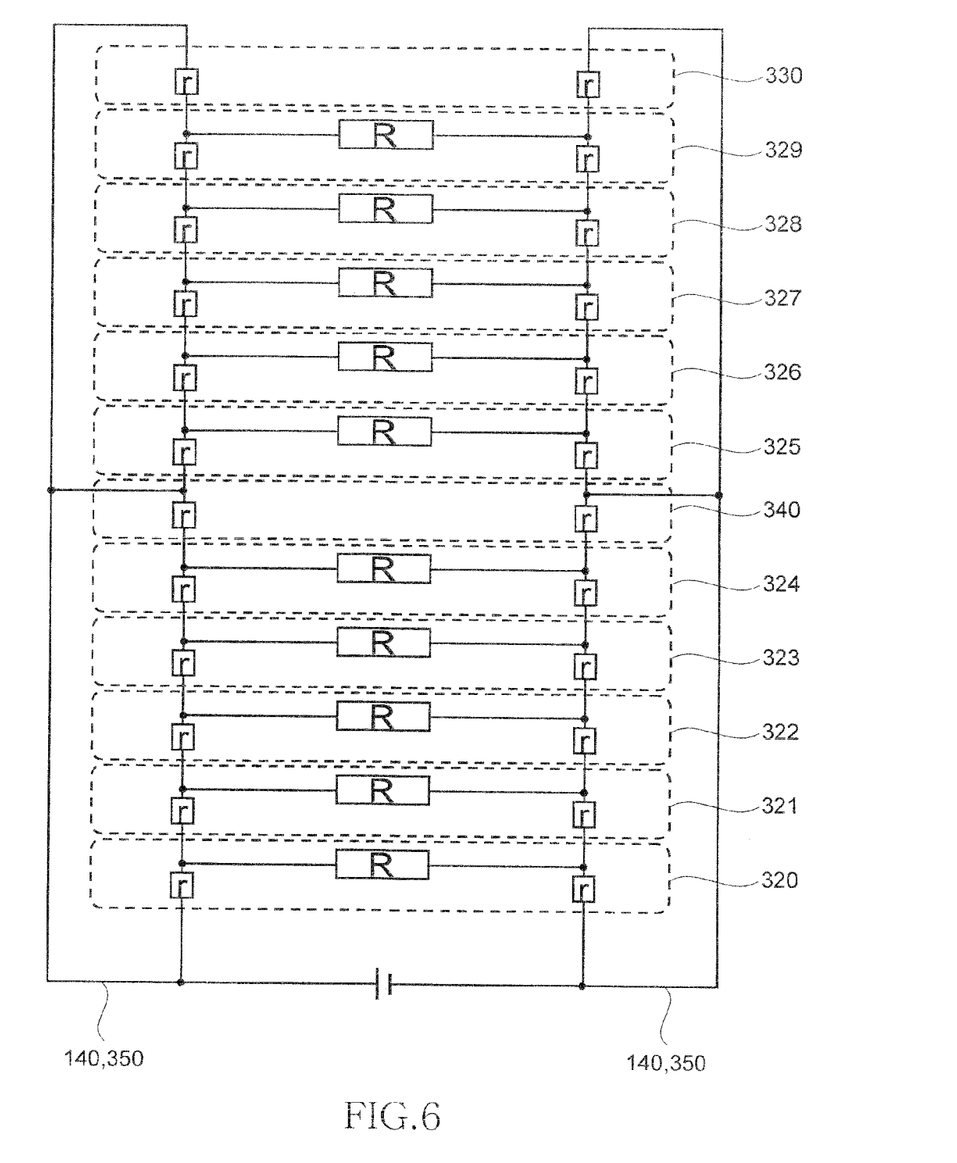
FIG. 6 is an equivalent circuit diagram showing only a power supply portion of the stacked semiconductor device shown in FIG. 5.

FIG. 6 is an equivalent circuit diagram showing only a power supply portion of the stacked semiconductor device 300 according to the present embodiment.

As shown in FIG. 6, in the stacked semiconductor device 300 according to the present embodiment, ten semiconductor chips 320 to 329 are stacked. In a conventional power supply method, it is supposed that the voltage applied to the semiconductor chip 329 located in the top layer will greatly decrease. However, in the present embodiment, the power source voltage is directly applied from three areas, that is, the semiconductor chip 320 located in the bottom layer, the semiconductor chip 329 located in the top layer, and the semiconductor chips 324 and 325 located in the intermediate portion.

That is, a loop structure of the power supply wiring in the present embodiment includes a first loop structure having a portion that goes through the through electrodes arranged in the semiconductor chips 320 to 324 and a portion that goes through the bonding pad 350; and a second loop structure having a portion that goes through the through electrodes arranged in the semiconductor chips 325 to 329 and a portion that goes through the bonding pads 140 and 350. This loop structure solves not only the problem such that the higher the semiconductor chip, the larger the voltage drop caused by the resistance component r, but also the problem in that the more intermediate the semiconductor chip located, the lower the voltage applied to the internal circuit. Accordingly, the present embodiment is suitable for a case in which the number of semiconductor chips to be stacked is large.

Also in this embodiment, the underfill material can be filled between the interposer substrate 110 and the intermediate interposer substrate 340, and between the intermediate interposer substrate 340 and the cap substrate 330.

The present invention is in no way limited to the aforementioned embodiments, but rather various modifications are possible within the scope of the invention as recited in the claims, and naturally these modifications are included within the scope of the invention.

For example, in the above embodiments, a through electrode is used as means for mutually connecting the power supply wirings each provided in adjacent semiconductor chips. However, other methods can be employed for the connection. Note that it is highly preferable to use the through electrode as the means mentioned above, to effectively benefit the advantages of the stacked semiconductor device.

In each of the above embodiments, while a plurality of semiconductor chips are stacked on the interposer substrate, such an interposer substrate is not always requisite. For example, the semiconductor chip in the bottom layer can be given a role as the interposer substrate. Also, for example, an interface chip is allotted as the semiconductor chip in the bottom layer, core chips are allotted as the plurality of semiconductor chips stacked on top of the interface chip, and the interface chip can be given a role of the interposer substrate.

In the above embodiments, while the bonding wire is used to bypass the power supply wiring, the bypass conductor is not limited to the bonding wire, and the use of another means, such as a TAB tape, can be also applicable.

In the above embodiments, while each semiconductor chip is stacked in the face-up manner, the stacking method is not limited thereto, and a face-down manner is also applicable. The semiconductor chips stacked in the face-up manner and stacked in the face-down manner can exist at the same time.

In the third embodiment, only one intermediate interposer substrate is arranged. However, a plurality of such intermediate interposer substrates can be arranged. This arrangement is effective when the number of semiconductor chips to be stacked is large.

When the intermediate interposer substrate is arranged, it is not requisite to bypass the power supply wiring from the semiconductor chip located in the top layer. The power supply wiring can be bypassed only via the intermediate interposer substrate. This is an effective configuration when it is not possible to arrange a bonding wire or the like that bypasses the power supply from the semiconductor chip located in the top layer. In this case, however, it is preferable to supply the power from three areas, that is, the bottom layer, the top layer, and the intermediate layer, as in the case of the third embodiment, because the power source voltage applied to the semiconductor chip located in the top layer slightly decreases.

The number of semiconductor chips shown in each of the embodiments is merely an example, and the number of semiconductor chips to be stacked is not particularly limited.

What is claimed is:

1. A stacked semiconductor device in which a plurality of semiconductor chips including at least first and second semiconductor chips are stacked, comprising:
   an external power supply terminal;
   a first connector that electrically connects a power supply wiring arranged in the first semiconductor chip and the external power supply terminal;
   a second connector outside said semiconductor chips that electrically connects a power supply wiring arranged in the second semiconductor chip and the external power supply terminal; and
   a third connector that mutually electrically connects the power supply wirings each provided in adjacent semiconductor chips.

2. The stacked semiconductor device as claimed in claim 1, wherein the third connector includes a through electrode arranged in the plurality of semiconductor chips.

3. The stacked semiconductor device as claimed in claim 1, wherein
   the plurality of semiconductor chips further include a third semiconductor chip arranged between the first semiconductor chip and the second semiconductor chip, and
   a power supply wiring of the third semiconductor chip is electrically connected to the power supply wirings of the first and the second semiconductor chips by the third connector, and is electrically connected in a bypassing manner to the external power supply terminal by a fourth connector different from the third connector.

4. The stacked semiconductor device as claimed in claim 1, further comprising an interposer substrate on which the external power supply terminal is arranged, wherein the plurality of semiconductor chips are stacked on the interposer substrate.

5. The stacked semiconductor device as claimed in claim 4, wherein the first semiconductor chip is a semiconductor chip nearest to the interposer substrate.

6. The stacked semiconductor device as claimed in claim 5, wherein the first connector includes a bump electrode that electrically connects the power supply wiring arranged in the first semiconductor chip and a power supply wiring arranged in the interposer substrate.

7. The stacked semiconductor device as claimed in claim 4, wherein the second semiconductor chip is a semiconductor chip farthest from the interposer substrate.

8. The stacked semiconductor device as claimed in claim 7, wherein the second connector includes a bypass conductor that electrically connects the power supply wiring arranged in the second semiconductor chip and a power supply wiring arranged in the interposer substrate.

9. The stacked semiconductor device as claimed in claim 8, wherein a plurality of the bypass conductors are arranged in parallel.

10. The stacked semiconductor device as claimed in claim 8, wherein the bypass conductor is a bonding wire.

11. The stacked semiconductor device as claimed in claim 7, further comprising a cap substrate arranged opposite, seen from the second semiconductor chip, to the interposer substrate, wherein the second connector electrically connects the external power supply terminal and the power supply wiring that is arranged in the second semiconductor chip, via the power supply wiring arranged in the cap substrate.

12. The stacked semiconductor device as claimed in claim 11, further comprising an underfill material that is arranged between the interposer substrate and the cap substrate, and covers the plurality of semiconductor chips.

13. The stacked semiconductor device as claimed in claim 4, wherein
   the plurality of semiconductor chips further include a third semiconductor chip arranged between the first semiconductor chip and the second semiconductor chip, and
   a power supply wiring of the third semiconductor chip is electrically connected to the power supply wirings of the first and the second semiconductor chips by the third connector, and is electrically connected in a bypassing manner to the external power supply terminal by a fourth connector different from the third connector.

14. The stacked semiconductor device as claimed in claim 13, further comprising an intermediate interposer substrate arranged between the first semiconductor chip and the second semiconductor chip, wherein
   the power supply wiring arranged in the third semiconductor chip and a power supply wiring arranged on the intermediate interposer substrate are electrically connected by a bump electrode, and
   the fourth connector includes a bypass conductor that electrically connects the power supply wiring arranged on the interposer substrate and the power supply wiring arranged on the intermediate interposer substrate.

15. A stacked semiconductor device, comprising:
   a plurality of stacked semiconductor chips; and
   a power supply wiring that supplies a power supply potential to the plurality of semiconductor chips, wherein
   the power supply wiring has a loop structure that includes a portion that goes through a through electrode arranged in the plurality of semiconductor chips, and a portion that goes through at least one bypass conductor.

16. The stacked semiconductor device as claimed in claim 15, further comprising an interposer substrate on which the plurality of semiconductor chips are mounted, wherein one end of the at least one bypass conductor is connected to the interposer substrate, and the other end of the at least one bypass conductor is connected to one of the plurality of semiconductor chips that is arranged in a top layer.

17. The stacked semiconductor device as claimed in claim 15, wherein
   the plurality of semiconductor chips include at least a first semiconductor chip group and a second semiconductor chip group,
   the at least one bypass conductor includes first and second bypass conductors, and
   the loop structure of the power supply wiring includes a first loop structure including a portion that goes through a through electrode arranged in the first semiconductor chip group and a portion that goes through the first bypass conductor; and a second loop structure including a portion that goes through a through electrode arranged in the second semiconductor chip group and a portion that goes through the first and the second bypass conductors.

18. The stacked semiconductor device as claimed in claim 17, further comprising an intermediate interposer substrate arranged between the first semiconductor chip group and the second semiconductor chip group, wherein
   one end of the first bypass conductor is connected to the interposer substrate and the other end of the first bypass conductor is connected to the intermediate interposer substrate, and
   one end of the second bypass conductor is connected to the interposer substrate and the other end of the second bypass conductor is connected directly or indirectly to a semiconductor chip that is arranged in a top layer and included in the second semiconductor chip group.

* * * * *